March 25, 1969 A. H. HAROLDSON ET AL 3,434,889

COPPER FOIL SURFACE TREATMENT

Filed Dec. 27, 1965

INVENTORS
ARTHUR H. HAROLDSON
HUBERT L. COX

ATTORNEY

United States Patent Office 3,434,889
Patented Mar. 25, 1969

3,434,889
COPPER FOIL SURFACE TREATMENT
Arthur H. Haroldson and Hubert L. Cox, Newark, Del., assignors to The Budd Company, Philadelphia, Pa., a corporation of Pennsylvania
Filed Dec. 27, 1965, Ser. No. 516,487
Int. Cl. C23f *7/06;* B23b *15/20, 15/04*
U.S. Cl. 148—6.14 3 Claims

ABSTRACT OF THE DISCLOSURE

A process for treating copper foil to improve its bonding strength with a substrate material provided. The foil is wet in a solution of hydrogen peroxide and then exposed to air. One side of the foil becomes oxidized without substantially affecting the other side.

This invention relates to the surface treatment of copper foil for application in copper clad plastic laminates used in printed circuits and the like and has for an object the provision of improvements in this art.

Relatively inexpensive copper foil, the so-called pink copper foil, has been generally available for some time. This material is the usual electrolytic foil produced by electroplating copper on a rotary drum. It exhibits a characteristic dull or mat surface on the side exposed to the bath and a smooth bright surface on the side in contact with the drum. One use of this material is for lamination to a substrate wherein the mat surface of the foil is adhesively bonded to a suitable substrate and has a printed circuit or the like formed on its smooth side. However, where peel strength requirements are high and where the laminate is subjected to molten solder contact, this pink electrolytic copper, as formed, is unsatisfactory. In other words, the pink copper laminates have poor resistance to mechanical and thermal delaminations. By way of comparison, a so-called Treatment-A foil has been found satisfactory in the more stingent applications, but it is approximately 30% more expensive than the pink copper foil.

For the above reasons many prior methods have been proposed for improving the bonding characteristics of inexpensive copper foil, these including electroplating of a non-continuous surface; production of cupric oxide from an alkaline plating polution; and the strong electrolytic processes employing sodium chloride, sodium hydroxide, trisodium phosphate and the like, which also provide a cupric oxide coating. Such an oxide formation is especially advantageous because it constitutes both a rough mechanical attachment surface for bonding and a heat insulating layer for retarding blistering and thermal delamination during molten solder immersion.

Concomitant with the advantages of the prior methods, however, are the disadvantages of increased cost due to expensive materials and further operations which they entail. For example, the introduction of strong reactants requires special washing operations and also special precautions to prevent, or extra steps to remove, deposits from the smooth obverse, non-laminating, side of the foil.

One of the specific objects of the present invention is to produce an improved low cost copper foil for laminates which yields high resistance to both mechanical and thermal delamination.

Another object is to provide a process for the preparation of inexpensive copper foil for printed circuit-type laminates which does not require expensive materials or strong electrolytes and which requires a minimum of protective or corrective steps.

A more specific object is to provide a method for improving the mat surface bonding properties of drum-plated electrolytic copper foil without deleterious effects upon the obverse smooth or bright surface, by the selective development of cuprous oxide on the mat surface through the agency of an inexpensive but mildly reactive solution.

For a better understanding of the invention together with additional objects and advantages, reference is made to the following specifications and to the accompanying drawings wherein.

Figure 2:
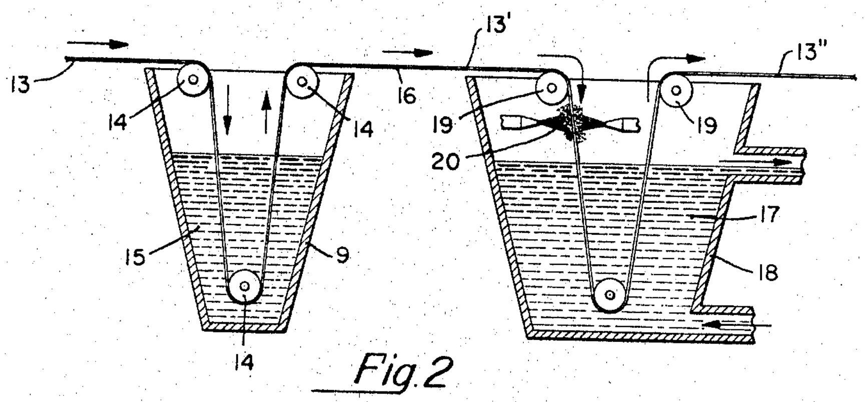
FIG. 2 is a diagrammatic vertical sectional view of apparatus for carrying out the process of the invention.

A preferred embodiment of this invention includes the steps of immersing the drum-plated electrolytic copper foil in a dilute aqueous bath comprising a solution of hydrogen peroxide, removing the foil from the bath, exposing the hydrogen-peroxide-treated foil in air, washing the exposed foil with water, and drying the washed foil, whereby a bond-enhancing cuprous oxide coating is formed on the mat surface of the foil with minimum effect upon the obverse bright surface. The solution is sufficiently concentrated to cause rapid oxidation when the foil is taken from the bath and exposed to air but not strong enough to cause oxidation and harmful dilution in the bath.

The reaction projected for the process of this invention may be expressed as:

$$H_2O_2 + 2\dot{C}u \text{ ------ } Cu_2O + H_2O$$

but probably, the reaction occurs in successive stages according to:

$$H_2O_2 \overset{air}{\text{------}} H_2O + O \text{ (nascent oxygen, very reactive)}$$

$$\underset{\text{(nascent oxygen)}}{O} + 2\dot{C}u \text{ ------ } \underset{\text{(Reddish brown oxide)}}{Cu_2O}$$

The cuprous oxide, $Cu_2O$, is reddish brown in color and is found to be selectively produced upon the mat surface of electrolytic drum-plated copper foil wetted with the hydrogen peroxide solution.

It is important to note that, while the reaction is initiated during immersion of the foil, the significant selective oxidizing effect is achieved during exposure of solution-wetted foil in air. This is explained upon the assumption that air performs a catalytic function in the dissassociation of the hydrogen peroxide into water and nascent oxygen, the mono-atomic oxygen being highly reactive with the copper.

The reaction is sufficiently sensitive to the extent of exposed surface area so that, during a controlled reaction, an effective cuprous oxide film is produced upon the mat foil surface as the adherent liquid dries off and before any significant coating is produced upon the bright foil surface.

The surface oxidation depends upon temperature, acidity or pH, and concentration of the hydrogen peroxide solution; immersion time; and time of exposure of the solution-wetted foil in the air.

For the following specific examples, the copper foil material was standardized as commercial drum-plated pink copper foil having a nominal thickness of 0.0014 in. After treatment, according to the process of this invention, the foil was laminated to a 1/16" thickness of standard resin-impregnated substrate material according to a conventional procedure and bonding adhesives for printed-circuit type laminates. The laminate was cut into 1 in. strips for peel strength tests and into 1 in. squares for thermal delamination blister tests. The copper clad laminates were evaluated according to Delco Radio specification M-9142. Peel strength was recorded in pounds per inch of width applied parallel to the laminate surface to produce peeling delamination at 180°. Thermal delamination was recorded as the time in seconds required for the production of blisters when the laminate specimen was floated with the copper side in contact with molten solder at 525° F.±10° F.

As a control, laminated samples of commercial untreated pink copper and of commercial Treatment-A copper foil were prepared and tested, according to the standard procedures outlined above.

CONTROL

Pink copper foil: Peel strength 7–8 lbs.; time to blister 1 sec.

Treatment-A copper foil: Peel strength 8.8 lbs.; time to blister 11 sec.

Treated copper foil: Peel strength 10 lbs.; time to blister 14 sec.

Example 1

Pink copper foil immersed in commercial 35% aqueous solution of hydrogen peroxide at room temperature. Reaction was immediate, oxygen released into the solution as soon as copper was wetted, resulting in uneconomic degradation of the solution. Peel strength and blister time improved, however.

Example 2

Pink copper foil immersed in dilute aqueous solutions, 5% to 7%, hydrogen peroxide. Blister time improved, but variation in peel strength due to cuprous oxide particle size variations.

Example 3

Pink copper foil immersed in 10% to 15% aqueous solutions of hydrogen peroxide. Blister time and peel strength uniformly and significantly improved.

Example 4

Pink copper foil immersed in dilute aqueous solution of hydrogen peroxide. Addition of acetic acid for control of solution pH. Resultant pH less than inhibited oxidation and dissolution of copper noted.

Example 5

Pink copper foil immersed in 10% to 15% aqueous solutions of hydrogen peroxide, pH 4 to 5, temperatures 25° to 40° C. Excellent peel and blister test results equalling or exceeding control values for Treatment-A foil.

Example 6

Same as Example 5 but wetted foils exposed to air before washing. Required immersion times reducible until no degradation of hydrogen peroxide stock solution detectable without loss of improved blister time and peel strength values.

Example 7

Aqueous solution 10% to 15% hydrogen perxoide, sufficient acetic acid to adjust to pH of 4 to 5, solution maintained at 25° C. to 40° C., immersion time 2 to 30 seconds, wetted foil exposed in air 3 to 30 seconds before washing. Positive improvement in both peel strength and time to blister. Average peel strength 8.8 to 11.2 lbs., average time to blister 8 to 14 sec.

Figure 1:
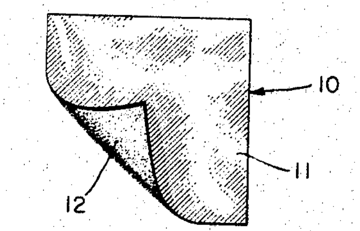
FIG. 1 is a face view of the smooth obverse side of a sheet of electro-deposited copper foil, one corner being turned over to show a portion of the reverse mat side.

Referring to the drawings, FIG. 1 shows a piece of pink electro-deposited sheet of film of copper 10 having a smooth drum-side surface 11 and a rough electrolyte-side 12.

FIG. 2 shows a sheet strip 13 of this electro-deposited material being fed over suitable rolls 14 into and out of a bath 15 of hydrogen-peroxide solution in a tank 9.

The hydrogen-peroxide solution-wetted band is exposed to air in the zone 16 where the length of span and speed of travel are factors in the amount of oxidation produced.

The oxidized band 13' is passed through a water washing bath 17 in a tank 18, as over rolls 19, a water spray wash 20 preferably being included, and emerges as the fully treated band 13''.

Figure 3:
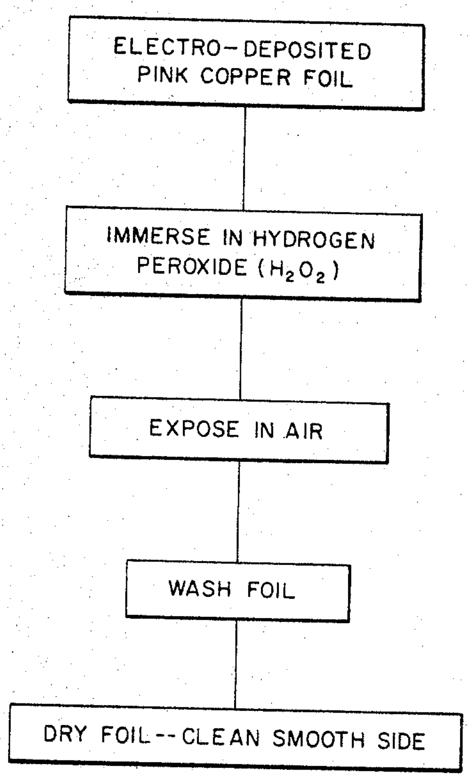
FIG. 3 is a flow diagram of the process.

FIG. 3 is a flow diagram of the process effected by the apparatus of FIG. 2 and, with the legends applied, will be understandable without specific description.

Figure 4:
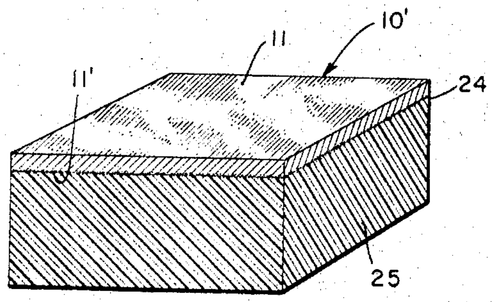
FIG. 4 is a cross section of a laminate using foil processed according to the present invention.

FIG. 4 shows a piece of processed material 10' bonded at its altered side 11' by a suitable adhesive 24 of known type to a substrate or lamina 25 of any desired type. The smooth drum side 11 is given its initial reference designation to indicate that it is substantially unchanged during the process.

It is important to note that the cuprous oxide is selectively formed on the mat side of drum plated copper foils. The so-called bright side of the foil does not exhibit significant oxidation within the ranges specified in Example 7 above. It is believed that this advantageous result is due to the extreme surface sensitivity of the mat side, there being a sufficient difference in total surface area due to the irregularities of the mat surface (facing the electroplating bath) as compared with the smooth drum surface to provide the differential reaction speed noted. Very little if any further treatment besides washing is required to prepare the obverse, non-laminating surface, of the foils when used for printed-circuit constructions and the like.

We claim:

1. The process of treating electro-deposited copper foil having a smooth side and a mat side to improve its resistance to mechanical thermal delamination from a bonded substrate, which comprises: wetting the foil in a bath with a dilute aqueous solution of hydrogen-peroxide without causing a substantial reaction between said foil and solution or contamination of said solution, removing said foil from said solution, exposing said foil to a gaseous oxidizing medium while still wet with said solution to produce oxidation on said mat side without substantial oxidation of the smooth side.

2. The method as set forth in claim 1, further characterized by the fact that the concentration of hydrogen-peroxide in the bath is from 10% to 15%.

3. The method as set forth in claim 2, further characterized by the fact that the pH of the bath is maintained at 4 to 5, temperature maintained at 25° C. to 40° C., the time of immersion 2 to 30 seconds, the time of drying in an oxidizing gas of the character of atmospheric air from 3 to 30 seconds, then washing in water to remove hydrogen-peroxide, and then drying the film and cleaning the smooth side.

References Cited

UNITED STATES PATENTS

| | | | |
|---|---|---|---|
| 2,551,591 | 5/1951 | Foord. | |
| 2,852,421 | 9/1958 | Bergstedt | 148—6.14 |

RALPH S. KENDALL, *Primary Examiner.*

U.S. Cl. X.R.

148—6.31; 156—3; 161—213